(12) United States Patent
Tomita et al.

(10) Patent No.: US 8,394,199 B2
(45) Date of Patent: Mar. 12, 2013

(54) PROCESSING DEVICE

(75) Inventors: Yasumitsu Tomita, Handa (JP); Yutaka Unno, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 460 days.

(21) Appl. No.: 11/375,815

(22) Filed: Mar. 15, 2006

(65) Prior Publication Data

US 2006/0219176 A1  Oct. 5, 2006

Related U.S. Application Data

(60) Provisional application No. 60/662,207, filed on Mar. 16, 2005.

(51) Int. Cl.
 C23C 16/00  (2006.01)

(52) U.S. Cl. .................. 118/715; 118/725

(58) Field of Classification Search .................. 118/725, 118/715; 3/725
See application file for complete search history.

(56) References Cited

U.S. PATENT DOCUMENTS

| | | | |
|---|---|---|---|
| 5,343,938 A | 9/1994 | Schmidt | |
| 5,508,240 A | 4/1996 | Komatsu et al. | |
| 5,527,393 A * | 6/1996 | Sato et al. | 118/725 |
| 5,551,983 A * | 9/1996 | Shepard et al. | 118/723 R |
| 5,676,758 A * | 10/1997 | Hasegawa et al. | 118/723 E |
| 5,800,618 A | 9/1998 | Niori et al. | |
| 5,888,304 A * | 3/1999 | Umotoy et al. | 118/720 |
| 5,946,183 A * | 8/1999 | Yamada et al. | 361/234 |
| 6,101,969 A | 8/2000 | Niori et al. | |
| 6,129,046 A * | 10/2000 | Mizuno et al. | 118/725 |
| 6,134,096 A | 10/2000 | Yamada et al. | |
| 6,179,924 B1 * | 1/2001 | Zhao et al. | 118/725 |
| 6,197,246 B1 | 3/2001 | Niori et al. | |
| 6,223,447 B1 | 5/2001 | Yudovsky et al. | |
| 6,494,955 B1 | 12/2002 | Lei et al. | |
| 6,583,979 B1 * | 6/2003 | Takahasi et al. | 361/234 |
| 6,702,900 B2 * | 3/2004 | Yeh et al. | 118/730 |
| 7,017,652 B2 * | 3/2006 | Mitrovic et al. | 165/80.2 |
| 2003/0136520 A1 * | 7/2003 | Yudovsky et al. | 156/345.51 |
| 2004/0117977 A1 | 6/2004 | Hiramatsu et al. | |
| 2004/0173161 A1 * | 9/2004 | Mariner et al. | 118/728 |

FOREIGN PATENT DOCUMENTS

| | | |
|---|---|---|
| JP | 06-151332 A1 | 5/1994 |
| JP | 07-172921 A1 | 7/1995 |
| JP | 09-134951 * | 5/1997 |
| JP | 09-134951 A1 | 5/1997 |
| JP | 2002-093894 A1 | 3/2002 |
| JP | 2003-142564 A | 5/2003 |
| KR | 10-0256995 | 4/1997 |
| WO | 99/56307 A1 | 11/1999 |

* cited by examiner

*Primary Examiner* — Parviz Hassanzadeh
*Assistant Examiner* — Satish Chandra
(74) *Attorney, Agent, or Firm* — Burr & Brown

(57) ABSTRACT

A processing device is provided, including a base which holds a processing target. A gas providing passage having a circular cross section is formed in the base, and provides gas to an outer circumference of the base.

2 Claims, 3 Drawing Sheets

FIG.4

| Category | Gas providing passage | | | | Gas flow rate [sccm] | | Uniform heating performance | |
|---|---|---|---|---|---|---|---|---|
| | Cross-sectional shape | Number | Cross-sectional dimension | Forming method | Gas providing passage 31a | 31b 31c 31d | Difference between maximum value and minimum value in temperature on base surface ΔT [°C] | Temperature lowering on surface of portion corresponding to gas providing passage |
| Example of Present invention | Circular | 4 | φ4mm | Machining | 9.7 | 9.2 9.3 9.6 | 5.3 | None |
| Comparative example | Rectangular | 4 | 6×2mm | Coupling of plates | 7.3 | 8.8 6.8 9.4 | 12.3 | Present |

PROCESSING DEVICE

CROSS REFERENCE TO RELATED APPLICATIONS

This application is based upon and claims the benefit of priority from prior U.S. Provisional Application No. 60/662,207, filed on Mar. 16, 2005; the entire contents of which are incorporated herein by reference.

BACKGROUND OF THE INVENTION

1. Field of the Invention

The present invention relates to a processing device.

2. Description of the Related Art

Heretofore, in a semiconductor manufacturing process and a liquid crystal device manufacturing process, a heating device which heats a substrate such as a semiconductor substrate and a liquid crystal substrate has been used. For example, as shown in Japanese Patent Laid-Open Publication No. 2002-93894, a gas providing passage which provides atmospheric gas to an outer circumference of the heating device is provided in the heating device. The conventional gas providing passage has been formed above a resistance heating body owned by the heating device. Moreover, the conventional gas providing passage has been formed by bonding a ceramic plate of which surface is formed into a planar shape and a ceramic plate on which a groove rectangular in cross section is formed to each other.

However, according to the conventional gas providing passage, there has been a problem that a flow of the atmospheric gas in the gas providing passage becomes unstable. Moreover, in some cases, the gas providing passage has been deformed by being heated at the time when the ceramic plates are bonded to each other. There is a possibility that such deformation causes the flow of the atmospheric gas in the gas providing passage to be more unstable, and as a result, it has been difficult to stably provide the gas.

SUMMARY OF THE INVENTION

It is an object of the present invention to provide a processing device capable of stably providing the gas.

A processing device according to an embodiment of the present invention includes a base which holds a processing target. Then, in the base, a gas providing passage circular in cross section, which provides gas to an outer circumference of the base, is formed. According to the processing device as described above, the cross section of the gas providing passage is formed into the circular shape, thus making it possible to stabilize a flow of the gas in the gas providing passage. Hence, the processing device can stably provide the gas to the outer circumference of the base.

BRIEF DESCRIPTION OF THE DRAWINGS

FIG. 4 shows results of Example.

DETAILED DESCRIPTION OF THE INVENTION

Figure 1A:
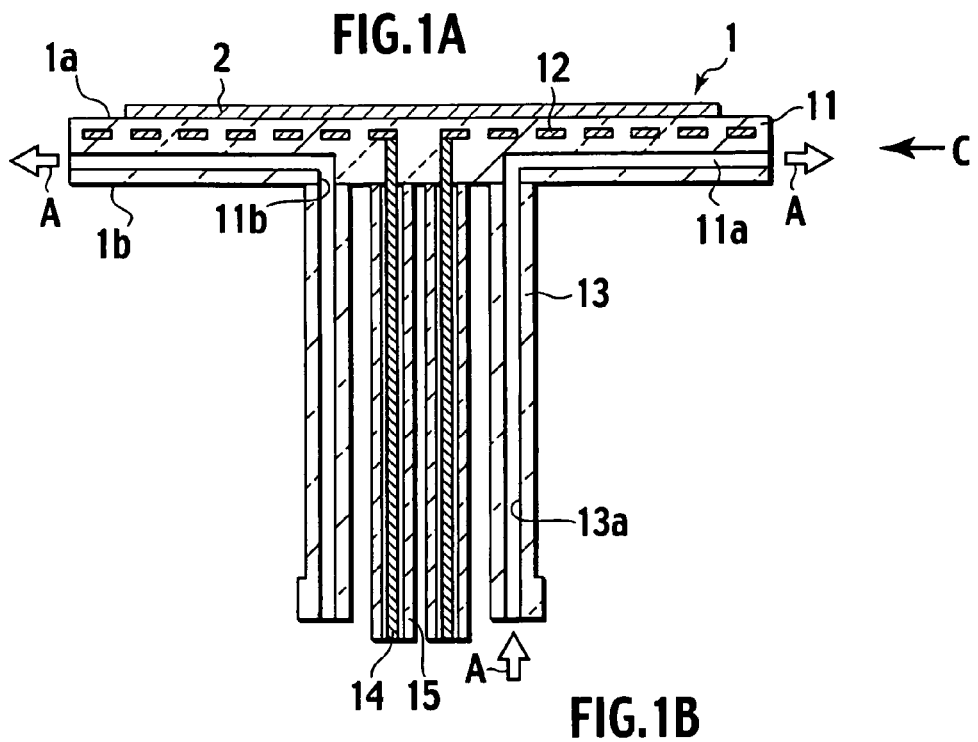
FIG. 1A is a cross-sectional view of FIG. 1B along a line 1A-1A, and a FIG. 1C is a side view when viewing FIG. 1A from a direction of an arrow C.
Figure 1B:
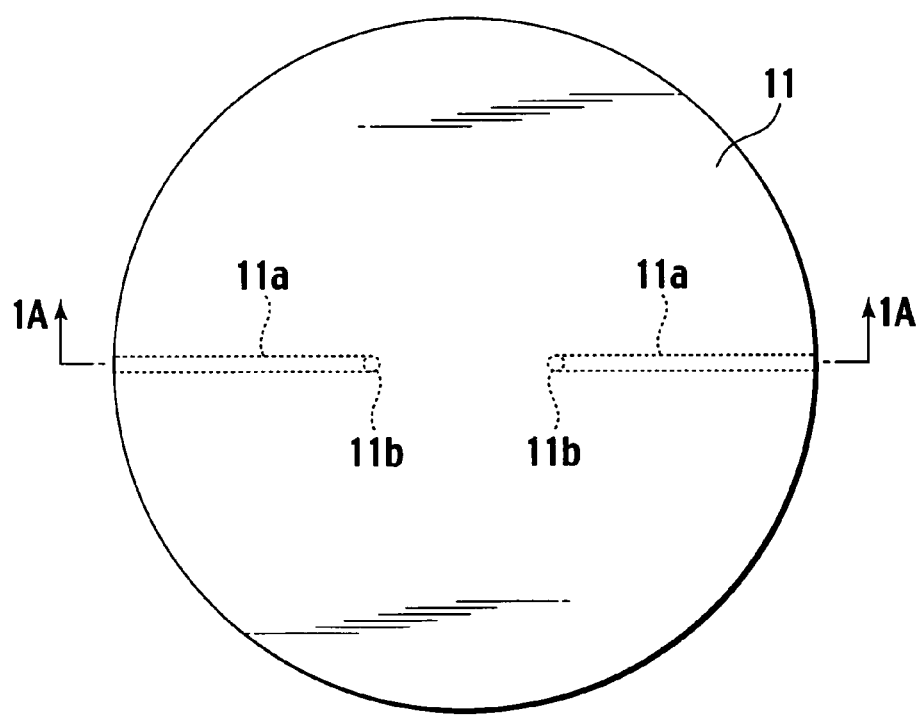
FIG. 1B is a plan view of a processing device according to an embodiment of the present invention.
Figure 1C:
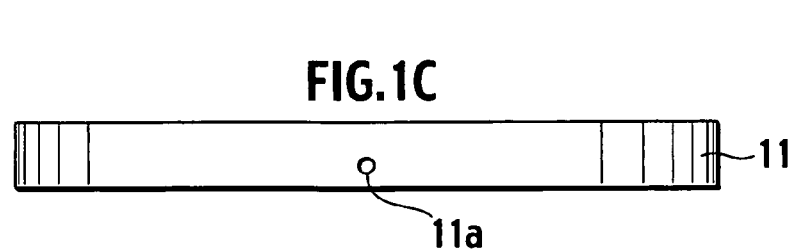

The processing device shown in FIG. 1A to FIG. 1C is a processing device which holds a processing target and performs a variety of processing for the processing target. The processing device 1 performs heating processing for the processing target. For example, the processing target includes a substrate 2 such as a semiconductor substrate and a liquid crystal substrate. The heating device 1 has a substrate mounting surface 1a, and the substrate 2 is mounted on the substrate mounting surface 1a. Then, the heating device 1 heats the substrate 2 on the substrate mounting surface 1a.

The heating device 1 includes a base 11, a resistance heating body 12, a tubular member 13, power supply members 14, and insulating pipes 15. The base 11 has the substrate mounting surface 1a, and holds the substrate 2 as the processing target. On the substrate mounting surface 1a, a concave portion (a pocket) for mounting the substrate 2 thereon, a plurality of convex portions (embosses), grooves, and the like, which support the substrate 2, may be formed. A shape of the base 11 is not limited. For example, the base 11 can be formed into a disc-like or polygonal plate shape. It is preferable that a thickness of the base 11 be 30 mm or less. According to this, thermal conductivity of the base 11 can be enhanced, and uniform heating performance of the substrate mounting surface 1a can be enhanced.

In the base 11, gas providing passages 11a which provide gas to an outer circumference of the base 11 are formed. Each gas providing passage 11a is provided to the tubular member 13 and provides the gas A introduced from the tubular member 13 to the outer circumference of the base 11. Then, the gas A is emitted from emission holes formed on the outer circumferential surface of the base 11. For example, as shown in FIG. 1A, the gas providing passage 11a can provide the gas A from the inside of the base 11 toward the outer circumference of the base 11. For example, the gas providing passage 11a can provide atmospheric gas which stabilizes a process in the substrate 2, reaction gas, and the like. For example, the gas providing passage 11a can provide nitrogen gas, argon gas, helium gas, and the like as the atmospheric gas.

The gas providing passage 11a has a circular cross-sectional shape, thus making it easy to generate a laminar flow in the gas providing passage 11a, and making it possible to stabilize the flow of the gas. Hence, the heating device 1 can stably provide the gas to the outer circumference of the base 11. For example, the flow of the gas in the gas providing passage 11a can be stabilized, and a loss of such a gas flow can be reduced. Hence, the heating device 1 can stably provide the gas at a desired flow rate.

It is preferable that the gas providing passage 11a be formed at a position closer to a back surface 1b of the base 11 than to the resistance heating body 12, that is, below the resistance heating body 12 in FIG. 1A. In the conventional heating device, the gas providing passage has been formed above the resistance heating body. Accordingly, a temperature distribution of the substrate mounting surface 1a has been changed by heat communication of the gas flowing in the gas providing passage, and it has been difficult to ensure the uniform heating performance of the substrate mounting surface 1a. As opposed to this, the gas providing passage 11a is formed below the resistance heating body 12, thus making it possible to prevent the gas providing passage 11a from affecting heat conduction from the resistance heating body 12. Hence, an influence given by the gas providing passage 11a to the temperature distribution of the substrate mounting surface 1a can be reduced, and the uniform heating performance of the substrate mounting surface 1a can be enhanced.

Moreover, it is preferable that each gas providing passage 11a be formed by machining. According to this, deformation of the gas providing passage 11a can be prevented, and the flow of the gas in the gas providing passage 11a can be stabilized more. Hence, the heating device 1 can provide the gas more stably. For example, the heating device 1 can provide the gas at the desired flow rate more stably.

Each gas providing passage 11a is formed to reach the outer circumference of the base 11 so as to be capable of providing the gas to the outer circumference of the base 11. For example, the gas providing passage 11a is formed from the center of the base 11 in the diameter direction toward the outside thereof in the diameter direction. Although the gas providing passage 11a may have a bent portion, it is preferable that the gas providing passage 11a be linear. According to this, the flow of the gas can be stabilized more stably, and the loss of the gas flow can be reduced more.

It is preferable that a diameter (inner diameter) of each gas providing passage 11a be 0.5 to 20 mm. According to this, the flow of the gas in the gas providing passage 11a can be stabilized more. Moreover, it is preferable that a length of the gas providing passage 11a be 50 to 300 mm. As described above, the gas providing passage 11a is formed into a cylindrical shape, and accordingly, the loss of the gas flow can be reduced more.

In the base 11, the gas providing passages 11a and coupling passages 11b are formed. Each coupling passage 11b couples the gas providing passage 11a and a gas introduction passage 13a which is formed in the tubular member 13 and introduces the gas into the gas providing passage 11a to each other. Specifically, on the back surface 1b of the base 11, which is an opposite surface to the substrate mounting surface 1a, through holes serving as the coupling passages 11b, through which both the gas providing passages 11a and the gas introduction passages 13a are connected to each other, are formed. Each coupling passage 11b couples the gas providing passage 11a and the gas introduction passage 13a to each other, and introduces, to the gas providing passage 11a, the gas A provided from the gas introduction passage 13a.

Moreover, a plurality of gas providing passages 11a can be formed. In such a way, the gas of which the flow rate is adjusted can be provided from each gas proving passage 11a. For example, such an adjustment can be performed so that the flow rates of the gas from all the gas providing passages 11a can be substantially the same. According to this, the heating device 1 can provide a substantially uniform amount of the gas from the plurality of gas providing passages 11a. Alternatively, an adjustment can be performed so that the gas flow rate of one gas providing passage 11a which provides the gas to a portion among the outer circumference of the base 11, to which the gas is desired to be provided concentratedly, can be made larger than those of the other gas providing passages 11a. According to this, the heating device 1 can provide the gas while increasing the flow rate thereof for the target portion more than those for the other portions. For example, a diameter, length, surface roughness, and the like of each gas providing passage 11 are adjusted, thus making it possible to adjust the gas flow rate from each gas providing passage 11a.

Figure 2A:
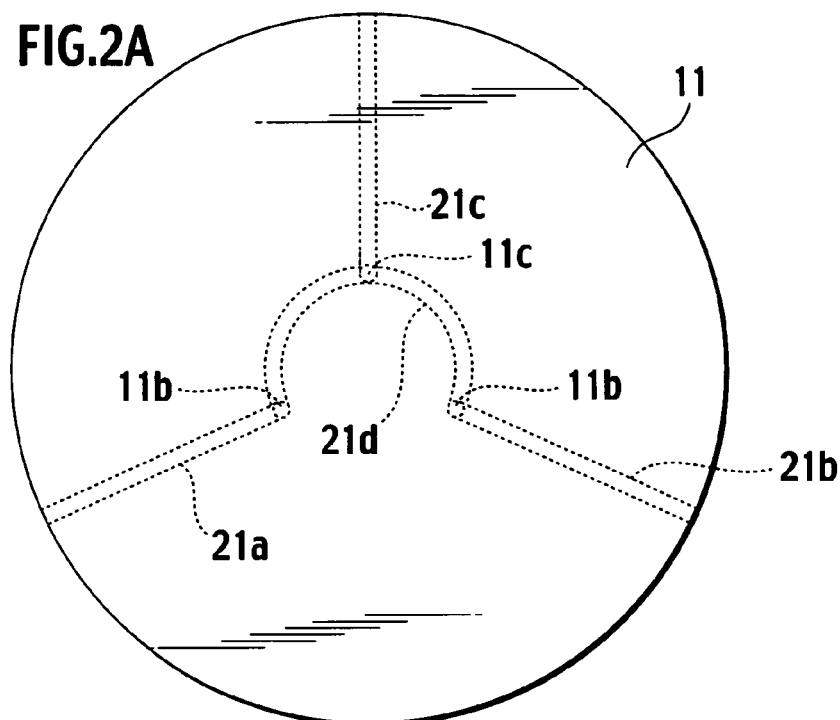
FIG. 2A and FIG. 2B are plan views showing gas providing passages and coupling passages of a processing device according to the embodiment of the present invention.
Figure 2B:
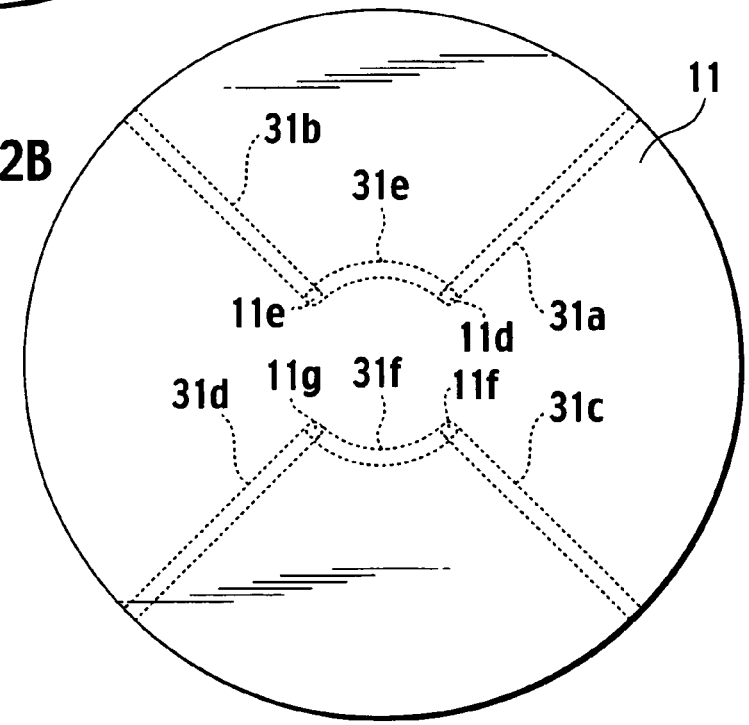

In the case of forming the plurality of gas providing passages 11a, for example, as shown in FIG. 1B, two gas providing passages 11a can be formed at an interval of 180° along the circumference direction of the base 11. Moreover, as shown in FIG. 2A, three gas providing passages 21a to 21c can be formed at an interval of 120°. Furthermore, as shown in FIG. 2B, four gas providing passages 31a to 31d can be formed at an interval of 90°. The number of gas providing passages is not limited, and as a matter of course, five or more gas providing passages may be formed. Moreover, the interval among the gas providing passages is not limited to such equal intervals, and may be different intervals.

As described above, in the case of forming the plurality of gas providing passages, the coupling passage which couples the plurality of gas providing passages to one another can be formed in the base 11. According to this, the gas can be distributed to the respective gas providing passages. Hence, the heating device 1 can stably provide the gas at the desired flow rate from the respective gas providing passages.

For example, as shown in FIG. 2A, a coupling passage 21d which couples the plurality of gas providing passages 21a to 21c to one another can be formed. Moreover, the plurality of coupling passages can also be formed. For example, as shown in FIG. 2B, a coupling passage 31e which couples the gas providing passage 31a and the gas providing passage 31b to each other, and a coupling passage 31f which couples the gas providing passage 31c and the gas providing passage 31d to each other, can be formed.

For example, the coupling passages 21d, 31e and 31f can be formed on the back surface of the base 11. For example, grooves and the like can be formed as the coupling passages 21d, 31e and 31f.

For example, as shown in FIG. 2A, the coupling passage 21d can be formed at a position of being connected to the coupling passages 11b. In such a way, the gas can be introduced into the gas providing passages 21a and 21b connected to the coupling passages 11b. Moreover, a coupling passage 11c which connects the coupling passage 21d and a gas providing passage 21c which is not connected to the coupling passage 11b to each other can be formed on the back surface of the base 11. As the coupling passage 11c, for example, a through hole connected to both of the gas providing passage 21c and the coupling passage 21d can be formed. In such a way, the gas can also be introduced to the gas providing passage 21c which is not connected to the coupling passage 11b. For example, as the coupling passage 21d as described above, a circular arc groove which connects the coupling passage 11b and the coupling passage 11c to each other can be formed. As the coupling passage, a linear groove may also be formed. By forming the coupling passage 21d into the circular arc groove, the lengths of the respective gas providing passages can be uniformed, and this is preferable.

Alternatively, as shown in FIG. 2B, a coupling passage 11d which connects the gas providing passage 31a and the gas providing passage 31e to each other, and a coupling passage 11e which connects the gas providing passage 31b and the coupling passage 31e to each other, can be formed on the back surface of the base 11. For example, as the coupling passage 11d, a though hole connected to both of the gas providing passage 31a and the coupling passage 31e can be formed. As the coupling passage 11e, a through hole connected to both of the gas providing passage 31b and the coupling passage 31e can be formed. As the coupling passage 31e, for example, a circular arc groove which connects the coupling passage 11d and the coupling passage 11e to each other can be formed. In this case, the coupling passage 31e is connected to the gas introduction passages 13a of the tubular member 13, and also functions as a coupling passage which couples the gas providing passages 31a and 31b and the gas introduction passages 13a to each other.

In a similar way, a coupling passage 11f which connects the gas providing passage 31c and the coupling passage 31f to each other, and a coupling passage 11g which connects the gas providing passage 31d and the coupling passage 31f to each other, can be formed on the back surface of the base 11. For example, as the coupling passage 11f, a through hole connected to both of the gas providing passage 31c and the coupling passage 31f can be formed. As the coupling passage 11g, a through hole connected to both of the gas providing passage 31d and the coupling passage 31f can be formed. As the coupling passage 31f, for example, a circular arc groove which connects the coupling passage 11f and the coupling passage 11g to each other can be formed. In this case, the coupling passage 31f is connected to the gas introduction passage 13a of the tubular member 13, and also functions as a coupling passage which couples the gas providing passages 31c and 31d and the gas introduction passages 13a to each other.

It is preferable to also form the coupling passages 21d, 31e and 31f by machining. It is preferable that widths of the coupling passages 21d, 31e and 31f (grooves) be 0.5 to 20 mm.

It is preferable that the base 11 be formed of ceramics. For example, the base 11 can contain aluminum nitride (AlN), silicon nitride ($Si_3N_4$), silicon carbide (SiC), alumina ($Al_2O_3$), sialon (SiAlON), and the like. According to this, the heating device 1 that has excellent corrosion resistance and heat resistance can be provided. It is more preferable that the base 11 contain aluminum nitride. According to this, uniform heating performance of the substrate mounting surface 1a can be enhanced.

The resistance heating body 12 is formed in the base 11. It is preferable that the resistance heating body 12 be embedded in the base 11. The resistance heating body 12 generates heat upon receiving a supply of electric power, and raises temperature of the substrate heating surface 1a. For example, the resistance heating body 12 can be formed of a high melting point material. For example, the resistance heating body 12 can be formed of tungsten, molybdenum, a tungsten-molybdenum alloy, tungsten carbide, molybdenum carbide, or the like. A form of the resistance heating body 12 is not limited, and for example, one formed by printing a printing paste containing high melting point material powder, a linear, coil-like, belt-like bulk body or sheet (foil) of the high melting point material, a thin film of the high melting point material, which is formed by CVD or PVD, and the like, can be used. Moreover, a shape of the resistance heating body 12 is not limited, either, and the resistance heating body 12 can be formed into a spiral shape, a mesh (wire netting) shape, a punched shape (punching metal), a shape having plural folded portions, and the like.

As shown in FIG. 1A, the tubular members 13 support the base 11. Moreover, each tubular member 13 introduces the gas into the gas providing passage 11a of the base 11. Specifically, the tubular member 13 has the gas introduction passage 13a which introduces the gas into the gas providing passage 11a. The gas introduction passage 13a communicates with the coupling passage 11b of the base 11, and introduces the gas A into the gas providing passage 11a through the coupling passage 11b. Note that, in the case of forming the gas providing passages 31a to 31d shown in FIG. 2B, the gas introduction passages 13a are connected to the coupling passages 31e and 31f of the base 11. For example, each gas introduction passage 13a can be made as a through hole which penetrates from a lower end of the tubular member 13 to an upper end thereof. It is preferable that a diameter of each gas introduction passage 13a be 2 to 10 mm. Moreover, on an inner circumference side of the tubular member 13, the power supply members 14 and the insulating pipes 15 are arranged.

Each tubular member 13 is bonded to the back surface of the base 11. For example, the tubular member 13 can be bonded to the base 11 by a solid-phase bonding method, a liquid-phase bonding method, and the like, which use a binder. In this case, the base 11 and the tubular member 13 can be integrated together, and air tightness of the gas introduction passage 13a of the tubular member 13 and the gas providing passage 11a of the base 11 can be ensured. Alternatively, the tubular member 13 can also be bonded to the base 11 by a sealing member such as an O-ring and a metal packing. Also in such a way, the air tightness of the gas introduction passage 13a of the tubular member 13 and the gas providing passage 11a of the base 11 can be ensured. Note that the bonding method of the base 11 and the tubular member 13 is not limited to these, and various bonding methods capable of ensuring the air tightness of the gas introduction passage 13a of the tubular member 13 and the gas providing passage 11a of the base 11 can be used.

In a similar way to the base 11, the tubular member 13 can be formed of the ceramics. It is preferable that the tubular member 13 be formed of the ceramics of the same type as that of the base 11.

The power supply members 14 are electrically connected to the resistance heating body 12, and supplies the electric power to the resistance heating body 12. The power supply members 14 can be connected to the resistance heating body 12 by brazing, welding, eutectic bonding, crimping, fitting, screwing, and the like. For each power supply member 14, a power supply rod, a power supply line (a power supply wire), a complex of the power supply rod and the power supply line, and the like, can be used. Preferably, the power supply members 14 are formed of metal, more preferably, of nickel. The power supply members 14 are housed in the insulating pipes 15. The insulating pipes 15 are bonded to the back surface of the base 11.

For example, the heating device 1 can be fabricated in the following manner. Ceramic powder serving as a main component and sintering aids are mixed together, and ceramic raw material powder is prepared. To the ceramic raw material powder, a binder, water, a dispersant, and the like are added and mixed, and slurry is made. The slurry is granulated by a spray granulation method and the like, and granulated powder is made. By using the granulated powder, a ceramic molded body is fabricated by a die molding method, a CIP method, a slip cast method, or the like. The ceramic molded body is fired under firing conditions (a firing temperature, a firing atmosphere, a firing method, and the like) corresponding to the ceramic raw material powder, and a ceramic sintered body is fabricated.

The resistance heating body 12 is formed on the ceramic sintered body. For example, the resistance heating body 12 can be formed by printing a printing paste containing the high melting point material powder on the ceramic sintered body by using a screen printing method or the like. Alternatively, the resistance heating body 12 can also be formed by mounting the bulk body or sheet (foil) of the high melting point material on the ceramic sintered body, and by forming the thin film of the high melting point material on the ceramic sintered body by the CVD or the PVD.

Next, the ceramic molded body is formed on the ceramic sintered body and the resistance heating body 12. For example, the ceramic sintered body on which the resistance heating body 12 is formed is set in a metal mold or the like, and the granulated powder is filled onto the ceramic sintered body and the resistance heating body 12, thus making it possible to form the ceramic molded body. Alternatively, the ceramic molded body may be fabricated by using the granulated powder by the die molding method, the CIP method, the slip cast method, or the like, and the ceramic molded body may be mounted and pressed on the ceramic sintered body and the resistance heating body 12.

Then, the ceramic sintered body, the resistance heating body 12, and the ceramic molded body are fired integrally according to the firing conditions corresponding to the ceramic raw material powder. In such a way, the base 11 in which the resistance heating body 12 is embedded can be fabricated. For example, the above-described bodies can be fired while being pressurized in one axial direction by using a hot press method or the like.

Note that a temporarily fired body of the ceramics may be fabricated in place of the ceramic sintered body, and that the resistance heating body 12 may be formed on the temporarily fired body of the ceramics. Alternatively, a laminated body of the ceramic molded body, the resistance heating body 12, and the ceramic molded body may be fabricated, and the laminated body may be fired integrally by the hot press method or the like.

The gas providing passages 11a are formed in the obtained base 11 by the machining. For example, the gas providing passages 11a are formed in the base 11 from the outside of the base 11 in the diameter direction toward the inside thereof in the diameter direction by a drilling processing using a machining center (MC) and the like. Moreover, holes for the coupling passages 11b and holes for inserting the power supply members 14 into the base 11 are formed therein by a process.

Separately from the base 11, a ceramic molded body serving as the tubular member 13 is fabricated by using granulated powder prepared in a similar way thereto by the die molding method, the CIP method, the slip cast method, or the like. Then, the ceramic molded body is fired under the firing conditions corresponding to the ceramic raw material powder, and the tubular member 13 is fabricated. The gas introduction passages 13a are formed by the machining in the obtained tubular member 13.

Then, the base 11 and the tubular member 13 are bonded to each other. At this time, the base 11 and the tubular member 13 are bonded to each other so that the coupling passages 11b and the gas introduction passages 13a can be fitted to each other. The base 11 and the tubular member 13 can be bonded to each other by the solid-phase bonding method and the liquid-phase bonding method, which use the binder, and seal bonding using the O-ring, the metal packing, and the like. Moreover, the insulating pipes 15 are inserted into the tubular member 13, and the base 11 and the insulating pipes 15 are also bonded to each other in a similar way to the above. Finally, the power supply members 14 are inserted into the insulating pipes 15, and are electrically connected to the resistance heating body 12.

Figure 3:
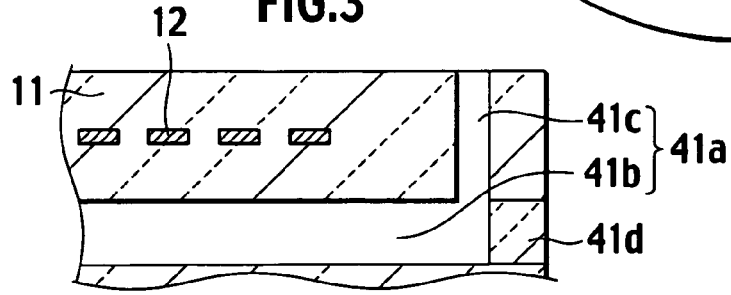
FIG. 3 is a partial cross-sectional view of the processing device according to the embodiment of the present invention.

Note that the present invention is not limited to the above-described embodiment, and various alterations are possible therefor. For example, the gas providing passages just need to be formed to reach the outer circumference of the base 11 so as to be capable of providing the gas to the outer circumference of the base 11. For example, as shown in FIG. 3, gas providing passages 41a may also be formed from the inside of the outer circumference of the base 11 toward the above.

Specifically, each gas providing passage 41a is formed into a substantially L shape in cross section, which has a passage 41b extended from the inside of the base 11 in the diameter direction toward the outside thereof in the diameter direction, and a passage 41c extended from the inside of the outer circumference of the base 11 toward the above.

For example, the gas providing passages 41a as described above can be formed in the following manner. First, as shown in FIG. 3, the passages 41b (lateral holes) are formed by the machining from a side surface of the base 11 toward the inside thereof in the diameter direction. Next, from an upper surface of the base 11 in the vicinity of the outer circumference of the base 11, the passages 41c (longitudinal holes) connected to the passages 41b are formed by the machining. Then, ends of the passages 41b (lateral holes) on the side surface of the base 11 are closed by sealing members 41d. Specifically, the sealing members 41d which are formed of the ceramics and are fitted into holes formed on the side surface of the base 11 are fixed by brazing, crimping, screwing, and the like.

Alternatively, the resistance heating body 12 may be provided on the surface of the base 11 without being embedded in the inside of the base 11. Moreover, the heating device 1 can include an electrostatic electrode which generates electrostatic absorption force, or a high-frequency electrode which excites the reaction gas. Specifically, the electrostatic electrode or the high-frequency electrode can be embedded in the base 11. Moreover, as a processing device, a plasma processing device which performs plasma processing for the substrate 2, a sputtering processing device which performs sputtering processing therefor, and the like, can be used besides the heating device 1.

EXAMPLES

Next, the present invention will be specifically described through an example.

Example of the Present Invention 95 wt % aluminum nitride powder and 5 wt % yttrium oxide powder (sintering aids) were mixed together, and the ceramic raw material powder was prepared. The binder (PVA), the water, and the dispersant were added to the ceramic raw material powder, and were mixed together by using a ball mill, and the slurry was thus made. The slurry was sprayed and dried by using a spray dryer, and the granulated powder was made. By using the granulated powder, an aluminum nitride molded body was fabricated by the die molding method. The aluminum nitride molded body was fired at 1900° C. in a nitrogen gas atmosphere by using the hot press method, and an aluminum nitride sintered body was fabricated.

Next, ethyl cellulose was mixed as the binder into a mixed powder of 80 wt % tungsten carbide and 20 wt % aluminum nitride powder, and the printing paste was prepared. The resistance heating body 12 was formed on the aluminum nitride sintered body by the screen printing method, followed by drying.

Next, the aluminum nitride sintered body on which the resistance heating body 12 was formed was set in a metal mold, and the granulated powder was filled onto the aluminum nitride sintered body and the resistance heating body 12, followed by pressurization, and an aluminum nitride molded body was fabricated. Then, the aluminum nitride sintered body, the resistance heating body 12, and the aluminum nitride molded body were set in a carbon-made sheath, and were fired at 1900° C. in the nitrogen gas atmosphere by the hot press method.

In such a way, the base 11 of the aluminum nitride sintered body with a diameter of 330 mm and a thickness of 25 mm was fabricated. The gas providing passages 31a to 31d and the coupling passages 31e, 31f and 11d to 11g, which are shown in FIG. 2B, are formed in the base 11 by machining using a machining center (MC). Specifically, four gas providing passages 31a to 31d were formed by the process from the side surface of the base 11 toward the inside thereof in the diameter direction at an interval of 90° along the circumference direction of the base 11. Diameters (φ) of the respective gas providing passages 31a to 31d were set at 4 mm, and lengths thereof were set at 135 mm. Moreover, two circular arc coupling passages 31e and 31f (grooves) were formed on the back surface of the base 11. Widths of the respective coupling passages 31e and 31f were set at 5 mm, depths thereof were set at 2 mm, and circular arc diameters (PCD) thereof were set at 60 mm. Moreover, the holes for inserting the power supply members 14 into the base 11 were formed thereon by the process.

Moreover, a tubular aluminum nitride molded body was fabricated by the CIP method using granulated powder similar to the above. Then, the tubular aluminum nitride molded body was fired at 1900° C. in the nitrogen gas atmosphere by a normal pressure firing method. In such a way, the tubular member 13 of the aluminum nitride sintered body with a diameter of 30 mm and a length of 250 mm was fabricated. As the gas introduction passages 13a, two through holes with a diameter (φ) of 5 mm were formed in the tubular member 13 by machining using a machining center (MC).

The base 11 and the tubular member 13 were bonded to each other so that centers of the coupling passages 31e and 31f formed on the base 11 and the gas introduction passages 13a of the tubular member 13 could be fitted to each other. In such a way, the gas introduction passages 13a and the gas providing passages 31a to 31d were connected to each other through the coupling passages 31e and 31f. Specifically, the binder was coated on the back surface of the base 11 and an end surface of the tubular member 13, and the base 11 and the tubular member 13 were subjected to a heat treatment at 1850° C., and thus were bonded to each other by the solid-phase bonding method. In a similar way to the above, the base 11 and the insulating pipes 15 were also bonded to each other. Finally, the power supply rods made of nickel were inserted as the power supply members 14 into the insulating pipes 15, and were bonded to the resistance heating member 12 by the brazing. A heating device 1 according to the Example of the Present Invention was fabricated in the above-described manner.

Nitrogen gas was provided as atmospheric gas at 20 sccm (standard cc/min) to the respective gas introduction passages 13a of the tubular member 13 of the obtained heating device 1. Then, flow rates of the gas provided from the respective gas providing passages 31a to 31d of the base 11 to the outer circumference of the base 11 were measured by using a flowmeter.

The flow rate of the gas from the gas providing passages 13a was 9.7 sccm, the flow rate of the gas from the gas providing passage 31b was 9.2 sccm, the flow rate of the gas from the gas providing passage 31c was 9.3 sccm, and the flow rate of the gas from the gas providing passage 31d was 9.6 sccm. Variations of the flow rates of the gas from the respective gas providing passages 31a to 31d were suppressed to be as extremely small as 1 sccm or less, and the atmospheric gas was able to be stably provided to the outer circumference of the base 11.

Comparative Example

Subsequently, a heating device according to a Comparative Example was fabricated. Basically, the heating device according to the comparative example was fabricated of materials by a procedure, both of which were similar to those of the heating device according to the Example of the Present Invention. However, gas providing passages in a base were formed by coupling two plate materials, one of which has grooves on a surface thereof, to each other. Specifically, two disc-like plates were fabricated, rectangular grooves were extended along the diameter direction on a surface of one of the plates, and the plate having the rectangular grooves formed thereon and the other plate of which surface was formed into a planar shape were coupled to each other. In such a way, the gas providing passages each having a rectangular shape in cross section with a width of 6 mm and a height of 2 mm were formed. Note that a diameter and thickness of the base and a length, number, and arrangement of the gas providing passages were set similar to those of the Example of the Present Invention.

Nitrogen gas was provided as atmospheric gas at 20 sccm (standard cc/min) to the respective gas introduction passages of a tubular member of the heating device thus obtained. Then, flow rates of the gas provided from the respective gas providing passages of the base to an outer circumference of the base were measured by using a flowmeter.

As shown in FIG. 4, the flow rates of the gas from the gas providing passages were 7.3 sccm, 8.3 sccm, 6.8 sccm, and 9.4 sccm. As described above, variation of the flow rates of the gas according to the Comparative Example was 2.6 sccm, which was double or more the variation according to the Example of the Present Invention.

Note that, in addition to the variation of the flow rates of the gas, which was described above, variation of uniform heating performance on the surface of the base was also verified. The members to be heated were housed in a vacuum atmosphere, and differences among surface temperatures of plural spots of each thereof when an average value of the temperatures on the surface of the base of each member to be heated reached 500° C. were measured by using an infrared radiometer. As shown in FIG. 4, a difference between the maximum value and the minimum value in the temperature on the surface of the base according to the example of the present invention was 5.3° C., and a difference between the maximum value and the minimum value in the temperature on the surface of the base according to the comparative example was 12.3° C. As described above, the temperature difference in the example of the present invention became half or less of the temperature difference in the comparative example, and it was found that the example of the present invention was has a more excellent uniform heating performance.

Moreover, in the case of the Comparative Example, the temperature of the surface of the base, which corresponded to the portions where the gas providing passages were formed, became lower than the temperature of the other portions. However, in the case of the Example of the present invention, such temperature lowering did not occur.

What is claimed is:

1. A processing device having a two-piece structure comprising:
    a tubular member including a plurality of gas introduction passages that penetrate from a lower end of the tubular member to an upper end thereof; and
    a unitary ceramic base, which holds a processing target on a front surface thereof, bonded to the tubular member on a back surface thereof, and which has a resistance heating body formed therein;
    wherein a plurality of gas providing passages are provided in the unitary ceramic base, each having a constant circular cross-sectional shape along its entire length and extending radially from a side surface of the unitary ceramic base toward an inside thereof in a direction that is linearly parallel to the front surface of the base;
    wherein arc shaped coupling passages are provided on a bonded area of the back surface of the unitary ceramic base and connected to ends of the gas providing passages, wherein ends of the coupling passages are formed in a center of the back surface of the unitary ceramic base and covered with an upper end face of the tubular member;

wherein the gas providing passages are formed closer to the back surface of the unitary ceramic base than to the resistance heating body; and whereby gas introduced from a lower end of the gas introduction passages in the tubular member is blown out from the side surfaces of the unitary ceramic base via the gas introduction passages, the coupling passages and the gas providing passages.

2. The processing device according to claim 1, wherein the gas providing passages are formed in the base by machining.

* * * * *